(12) United States Patent
Noda et al.

(10) Patent No.: US 8,884,499 B2
(45) Date of Patent: Nov. 11, 2014

(54) PIEZOELECTRIC ELEMENT

(75) Inventors: Toshinari Noda, Osaka (JP); Takashi Kubo, Osaka (JP); Hisao Suzuki, Aichi (JP); Naoki Wakiya, Tokyo (JP); Naonori Sakamoto, Shizuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/125,520

(22) PCT Filed: Aug. 6, 2012

(86) PCT No.: PCT/JP2012/004978
§ 371 (c)(1),
(2), (4) Date: Dec. 11, 2013

(87) PCT Pub. No.: WO2013/021614
PCT Pub. Date: Feb. 14, 2013

(65) Prior Publication Data
US 2014/0091677 A1    Apr. 3, 2014

(30) Foreign Application Priority Data

Aug. 8, 2011    (JP) .................................. 2011-172773

(51) Int. Cl.
*H01L 41/047* (2006.01)
*H01L 41/08* (2006.01)
*H01L 41/187* (2006.01)

(52) U.S. Cl.
CPC .......... *H01L 41/047* (2013.01); *H01L 41/0478* (2013.01); *H01L 41/081* (2013.01); *H01L 41/1876* (2013.01)
USPC ............ 310/364; 310/363; 310/365; 310/346

(58) Field of Classification Search
CPC ........................................................ B41J 2/161
USPC ......................................... 310/363–366, 346
See application file for complete search history.

(56) References Cited

U.S. PATENT DOCUMENTS

| | | | |
|---|---|---|---|
| 5,504,388 A * | 4/1996 | Kimura et al. ................ 310/363 |
| 5,995,359 A | 11/1999 | Klee et al. | |
| 6,097,133 A | 8/2000 | Shimada et al. | |
| 2003/0164660 A1 | 9/2003 | Ikeda et al. | |
| 2005/0128255 A1 | 6/2005 | Nakanishi | |

(Continued)

FOREIGN PATENT DOCUMENTS

| CN | 1805163 A | 7/2006 |
| CN | 102077376 A | 5/2011 |

(Continued)

OTHER PUBLICATIONS

International Search Report issued in PCT/JP2012/004978, dated Sep. 4, 2012.

(Continued)

*Primary Examiner* — Thomas Dougherty
(74) *Attorney, Agent, or Firm* — McDermott Will & Emery LLP

(57) ABSTRACT

A piezoelectric element includes a substrate, a lower electrode layer, a piezoelectric layer, and an upper electrode layer. The lower electrode layer is fixed to the substrate and the piezoelectric layer is formed on the lower electrode layer. The upper electrode layer is formed on piezoelectric layer. The lower electrode layer contains pores therein and has a larger thermal expansion coefficient than the piezoelectric layer.

19 Claims, 6 Drawing Sheets

(56) References Cited

U.S. PATENT DOCUMENTS

| | | | |
|---|---|---|---|
| 2006/0138906 | A1 | 6/2006 | Iwashita et al. |
| 2008/0218560 | A1 | 9/2008 | Noguchi et al. |
| 2009/0289130 | A1* | 11/2009 | Okamura et al. .......... 239/585.1 |
| 2010/0320871 | A1 | 12/2010 | Suenaga et al. |
| 2011/0101828 | A1 | 5/2011 | Noda et al. |
| 2011/0168808 | A1* | 7/2011 | Mitch .......................... 239/163 |
| 2012/0206019 | A1 | 8/2012 | Noda et al. |

FOREIGN PATENT DOCUMENTS

| | | |
|---|---|---|
| JP | 06-338214 A | 12/1994 |
| JP | 2006-100622 A | 4/2006 |
| JP | 2008-218716 A | 9/2008 |
| JP | 2008-251916 A | 10/2008 |
| JP | 2009-290374 A | 12/2009 |
| JP | 2010-016010 A | 1/2010 |
| JP | 2011-029591 A | 2/2011 |
| JP | 2011-109112 A | 6/2011 |

OTHER PUBLICATIONS

Anonymous, "Coefficients of Linear Thermal Expansion: Linear temperature expansion coefficients for some common materials as aluminum, copper, glass, iron and many more." The Engineering ToolBox: Retrieved from the internet: URL: http://www.engineeringtoolbox.com/linear-expansion-coefficients-d_95.html; retrieved Apr. 30, 2014; 9 pages.

Anonymous, "Technical Data for Gold," Periodictable.com, Retrieved from the Internet: http://www.periodictable.com/Elements/079/data.html; retrieved Apr. 30, 2014.

Hayashi, H. et al. "Thermal Expansion Coefficient of Yttria Stabilized Zirconia for Various Yttria Contents," Solid State Ionics, Elsevier. 2005, 176 (613-619).

Saravanan, R. et al. "Effects of Copper Oxide Doping on the Properties of Sodium Potassium Niobate (Na0.5K0.5) NbO3 Piezoelectric Single Crystals Grown by Flux Method." International Journal of Applied Physics and Mathematics. Jul. 2012. vol. 2; No. 4; 256-259.

Shibata, K. et al. "Curie Temperature, Biaxial Elastic Modulus, and Thermal Expansion Coefficient of (K,Na)NbO3 Piezoelectric Thin Film." Japanese Journal of Applied Physics. 2009. vol. 48. 121408-1-5.

Supplementary European Search Report mailed May 23, 2014, in corresponding EP Patent Application No. 12822515; 10 pages.

Chinese Search Report issued in Chinese Application No. 201280038771.9 dated Jun. 17, 2014, w/Partial English translation.

* cited by examiner

PIEZOELECTRIC ELEMENT

RELATED APPLICATIONS

This application is the U.S. National Phase under 35 U.S.C. §371 of International Application No. PCT/JP2012/004978, filed Aug. 6, 2012, which in turn claims the benefit of Japanese Application No. 2011-172773, filed on Aug. 8, 2011, the disclosures of which Applications are incorporated by reference herein.

TECHNICAL FIELD

The present invention relates to a piezoelectric element having a piezoelectric body capable of electromechanical transduction as its drive source.

BACKGROUND ART

Oxide ferroelectric thin films each having a perovskite structure, expressed by the general formula of $ABO_3$, exhibit superior ferroelectricity, piezoelectricity, pyroelectricity, and electro-optical characteristics. Accordingly, the thin films are used as material effective for a wide range of devices including various types of sensors, actuators, and memory, and thus supposedly application range thereof will further expand.

Among them, a thin film based on lead zirconate titanate (general formula: $Pb(Zr_xTi_{1-x})O_3$ ($0<x<1$), described as PZT hereafter) has high piezoelectricity. Accordingly, PZT is used as a piezoelectric displacement element for a piezoelectric sensor or a piezoelectric actuator, for instance. A piezoelectric sensor uses a piezoelectric effect with ferroelectricity. A ferroelectric substance has spontaneous polarization inside itself, generating positive and negative charges on its surface. In a steady state in the air, the substance combines with charges of atmospheric molecules to be in a neutral state. With an external pressure on the substance, an electric signal corresponding to the pressure can be extracted from the substance. A piezoelectric actuator as well uses the same principle. More specifically, with a voltage applied to the piezoelectric body, the body expands and contracts according to the voltage, causing displacement in the elastic direction or its orthogonal direction.

An attempt is made to produce a PZT-based thin film using vapor growth method such as sputtering, chemical vapor deposition (hereafter, described as CVD), and pulsed laser deposition (hereafter, described as PLD). Further, liquid phase growth method is used such as chemical solution deposition (hereafter, described as CSD) and hydrothermal synthesis. Among these methods, CSD features easy composition control and thin film production with high reproducibility, as well as inexpensive producing facilities for mass production.

FIG. 9 shows the element structure of a conventional PZT-based thin film. Unimorph-type piezoelectric film element 1 includes substrate 2, diaphragm 3, intermediate film 4, electrode film 5, and piezoelectric film 6.

Substrate 2 made of Si has hollow 2A. Diaphragm 3 of $SiO_2$ is formed by thermally oxidizing substrate 2. Intermediate film 4 of MgO is formed on diaphragm 3 and electrode film 5 is laminated on film 4. Piezoelectric film 6 is formed by nonthermally forming a PZT film by RF sputtering followed by burning the film.

$SiO_2$ forming diaphragm 3 has a thermal expansion coefficient of $0.2\times10^{-6}$ (/° C.) and a Young's modulus of $7.2\times10^{10}$ ($N/m^2$). MgO has a thermal expansion coefficient of $13.0\times10^{-6}$ (/° C.) and a Young's modulus of $20.6\times10^{10}$ ($N/m^2$).

Intermediate film 4 is formed after removing the MgO film with a high thermal expansion coefficient by wet etching only at the part corresponding to hollow 2A of substrate 2 being left. After that, electrode film 5 is formed on intermediate film 4. Electrode film 5 is composed of a close-contact layer and a first electrode. First, a 4-nm-thick Ti layer as the close-contact layer is formed by RF sputtering, and then a 150-nm-thick Pt layer as the first electrode is formed on the close-contact layer by RF sputtering. On the first electrode, a 1-μm-thick PZT layer of amorphous is formed by RF sputtering with a substrate heater turned off, with an Ar gas pressure of 3.0 Pa. The amorphous PZT layer is usually crystallized on an MgO substrate by heat treatment at 650° C., becoming a PZT film as piezoelectric film 6. PZT has a thermal expansion coefficient of $9.0\times10^{-6}$ (/° C.) and a Young's modulus of $8.0\times10^{10}$ ($N/m^2$) at the composition proximity of the morphotropic phase boundary (MPB).

After the formed amorphous PZT layer is heated to 650° C. at a temperature rising speed of 1° C. per minute in an oxygen atmosphere, the layer is annealed for 5 hours at a constant temperature of 650° C. Then, the layer is crystallized by being cooled at a temperature falling speed of 1° C. per minute. As the cooling process proceeds from the crystallization temperature, diaphragm 3 thermally contracts to an extremely small extent as indicated by the arrow in FIG. 9, and the contraction acts on the other layers in a tensile direction. Intermediate film 4 of MgO with a high thermal expansion coefficient tends to contract while cancelling the tensile force.

Each thickness of the layers is determined so as to satisfy a relation of [(Thermal expansion coefficient×Young's modulus×Thickness of intermediate film 4)−(Thermal expansion coefficient×Young's modulus×Thickness of diaphragm 3)≥(Thermal expansion coefficient×Young's modulus×Thickness of piezoelectric film 6)]. Furthermore, with a relation of [(Thermal expansion coefficient of intermediate film 4)>(Thermal expansion coefficient of piezoelectric film 6)] satisfied, a compressive force can be made act on piezoelectric film 6 in the temperature region from the crystallization temperature to the room temperature.

Moreover, diaphragm 3 is as thin as 1 μm and intermediate film 4 is formed only in the movable region of diaphragm 3 that is deformed facing hollow 2A of substrate 2. Accordingly, the part facing the partition wall except hollow 2A is not locked by diaphragm 3 so much, and thus diaphragm 3 facing hollow 2A of substrate 2 is deformed toward hollow 2A to a large degree in reaction to a large contraction of intermediate film 4 in the cooling process. Therefore, the compressive stress remains.

This prevents 90-degree domains from increasing when piezoelectric film 6 is cooled from the firing temperature to the room temperature, thereby exhibiting a favorable squareness ratio, a high saturated electric flux density, and desirable hysteresis characteristics in the curve of [P (polarization value)−E (applied electric field)] that represents the relationship between an electric field intensity and its electric flux density.

Examples of information on prior art documents relating to this patent application include patent literature 1.

CITATION LIST

Patent Literature

PTL 1 Japanese Patent Unexamined Publication No. 2006-100622

SUMMARY OF THE INVENTION

A piezoelectric element of the present invention includes a substrate, a lower electrode layer, a piezoelectric layer, and an upper electrode layer. The lower electrode layer is fixed to the substrate and the piezoelectric layer is formed on the lower electrode layer. The upper electrode layer is formed on the piezoelectric layer. The lower electrode layer contains pores therein and has a larger thermal expansion coefficient than the piezoelectric layer.

With this structure, the lower electrode layer, having a porous structure containing pores therein, moderates thermal stress from the substrate. Accordingly, when a substrate (e.g., silicon) with a small thermal expansion coefficient is used, the structure prevents tensile stress due to a restraint by the substrate to be applied to the piezoelectric layer. Further, since the lower electrode layer has a larger thermal expansion coefficient than the piezoelectric layer, thermal stress allows the piezoelectric layer to be applied with stress in the direction of compression. Consequently, a piezoelectric element with high piezoelectricity is achieved.

DESCRIPTION OF EMBODIMENT

Figure 9:
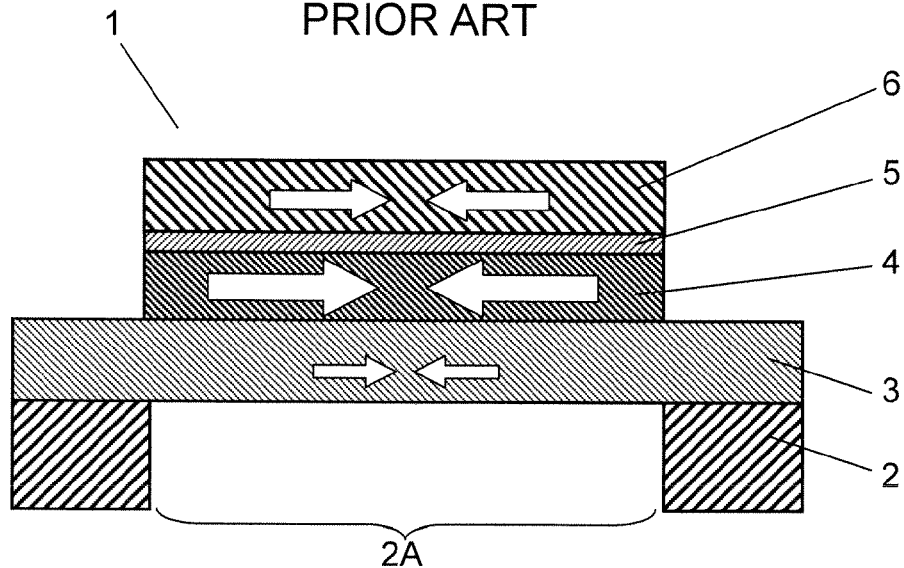
FIG. 9 is a sectional view of a conventional piezoelectric element.

The element structure shown in FIG. 9, in spite of having high ferroelectric characteristics, is subject to a lot of constraints in usable materials and the element structure. Hereinafter, a description is made of a piezoelectric element according to the embodiment of the present invention that is not restricted by the element structure and provides favorable piezoelectric characteristics.

Figure 1:
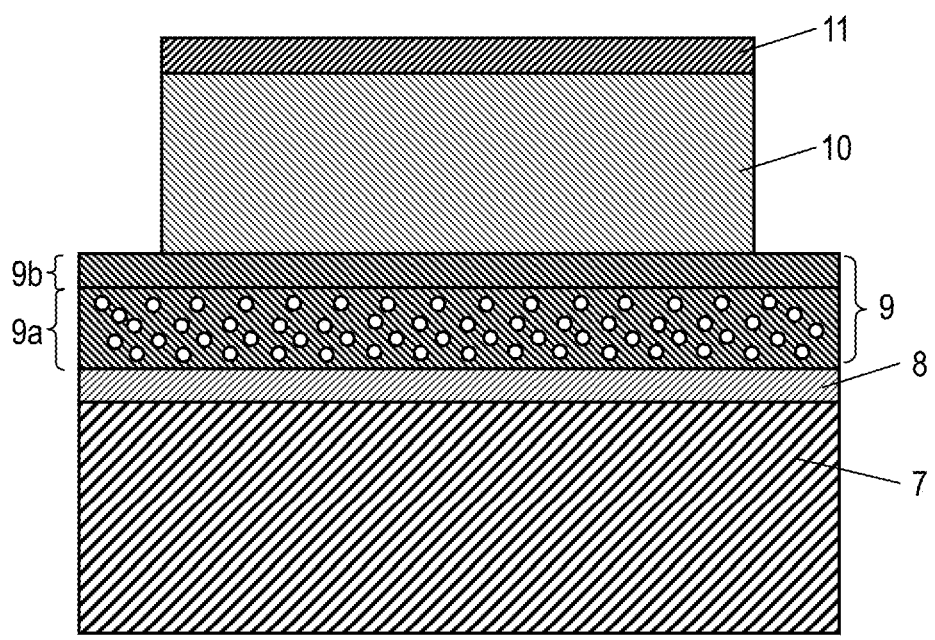
FIG. 1 is a sectional view of a piezoelectric element according to an embodiment of the present invention.

FIG. 1 is a sectional view illustrating the structure of a piezoelectric element according to an embodiment of the present invention. This piezoelectric element includes substrate 7, diffusion prevention layer 8, lower electrode layer 9, piezoelectric layer 10, and upper electrode layer 11. Diffusion prevention layer 8 is formed on substrate 7 and lower electrode layer 9 is formed on diffusion prevention layer 8. Piezoelectric layer 10 is formed on lower electrode layer 9 and upper electrode layer 11 is formed on piezoelectric layer 10.

Lower electrode layer 9 has first lower electrode layer 9a and second lower electrode layer 9b in this order from the substrate 7 side.

First lower electrode layer 9a has a porous structure containing pores therein. Second lower electrode layer 9b positioned closer toward piezoelectric layer 10 has a closely packed structure with less pores than first lower electrode layer 9a.

In the structure shown in FIG. 1, the respective thermal expansion coefficients of substrate 7, lower electrode layer 9, and piezoelectric layer 10 have the relationship shown by (Substrate 7<Piezoelectric layer 10<Lower electrode layer 9). Further, in lower electrode layer 9, where second lower electrode layer 9b is more closely packed than first lower electrode layer 9a, the thermal expansion coefficients have the relationship shown by (First lower electrode layer 9a<Second lower electrode layer 9b). In other words, first lower electrode layer 9a has a larger thermal expansion coefficient than piezoelectric layer 10.

Examples of a material of substrate 7 include a semiconductor monocrystalline substrate as represented by silicon, metallic materials such as stainless-steel material, titanium, aluminum, and magnesium, glass-based material such as quartz glass and borosilicate glass, and ceramic-based material such as alumina and zirconia. Silicon and quartz glass are particularly effective to be used because of their thermal expansion coefficient sufficiently smaller than that of piezoelectric layer 10.

Diffusion prevention layer 8 prevents mutual diffusion of the constituent elements of substrate 7 and piezoelectric layer 10 as a first effect. Diffusion prevention layer 8 further prevents oxidation of substrate 7 as a second effect. Diffusion prevention layer 8 is preferably made of amorphous oxide material that does not include grain boundaries such as silicon dioxide and aluminum oxide, which allows substrate 7 to be made of even an easily oxidized material such as metal.

Lower electrode layer 9 of a material primarily containing nickel oxide lanthanum ($LaNiO_3$, described as LNO hereafter), is formed on diffusion prevention layer 8 which is formed on substrate 7. Diffusion prevention layer 8, however, does not need to be formed when substrate 7 does not undergo oxidation in the producing process or when element diffusion does not occur from substrate 7 or piezoelectric layer 10. In such a case, lower electrode layer 9 may be formed directly on substrate 7 and thus it is adequate if lower electrode layer 9 is fixed to substrate 7, directly or indirectly.

LNO has space group R-3c and a perovskite structure distorted in a rhombohedral (rhombohedral system: $a_0=5.461$ Å ($a_0=a_p$), $\alpha=60°$, pseudo-cubic system: $a_0=3.84$ Å). The resistivity is $1\times10^{-3}$ ($\Omega \cdot cm$, 300 K), which means LNO is an oxide with metallic conductivity, where transition does not occur between the metal and the electric insulator with temperature changes.

Examples of a material primarily containing LNO include a material produced by replacing part of nickel with another metal, such as $LaNiO_3$—$LaFeO_3$-based material replaced with iron; $LaNiO_3$—$LaAlO_3$-based material replaced with aluminum; $LaNiO_3$—$LaMnO_3$-based material replaced with manganese; and $LaNiO_3$—$LaCoO_3$-based material replaced with cobalt.

Piezoelectric layer 10 of PZT with (001) plane orientation of a rhombohedral system or tetragonal system, is formed on lower electrode layer 9 which is formed on substrate 7. The PZT has a composition of (Zr:Ti=53:47) near the morphotropic phase boundary (MPB) between the tetragonal system and the rhombohedral system. The composition of Zr and Ti in piezoelectric layer 10 is not limited to Zr:Ti=53:47, but any composition may be used as long as $30/70 \leq Zr/Ti \leq 70/30$. The constituent material of piezoelectric layer 10 may be anything as long as it is a perovskite oxide ferroelectric substance containing PZT as a main component and containing an additive such as Sr, Nb, Mg, Zn, or Al. Alternatively, the constituent material of piezoelectric layer 10 may be PMN (chemical formula: $Pb(Mg_{1/3}Nb_{2/3})O_3$) or PZN (chemical formula: $Pb(Zn_{1/3}Nb_{2/3})O_3$).

The PZT of a tetragonal system used in this embodiment has a lattice constant of a=b=4.036 Å, c=4.146 Å in the value of bulk ceramics. Hence, LNO of a pseudo-cubic structure having a lattice constant of a=3.84 Å provides favorable lattice matching to (001) and (100) planes of the PZT.

The term "lattice matching" refers to the lattice matching between unit lattice of PZT and unit lattice of LNO. It has been reported that, in general, when a crystal plane is exposed to a surface of a crystal, the crystal lattice of the crystal and the crystal lattice of a film to be formed on the crystal are promoted to match each other, thereby forming an epitaxial crystal nuclei at the boundary. It is preferable that the difference between the lattice constant of the (001) or (100) plane, which is main orientation plane, of piezoelectric layer 10 and the lattice constant of the main orientation plane of lower electrode layer 9 be ±10% or less in absolute value. In this range, piezoelectric layer 10 can have high orientation in (001) or (100) plane. Thereby, epitaxial crystal nuclei can be formed at the boundary between substrate 7 and piezoelectric layer 10. Here, in orientation control by lattice matching, it is difficult to achieve a film selectively oriented to (001) or (100) plane.

By the production method described later, a LNO film preferentially oriented to (100) plane can be formed on various substrates. Hence, lower electrode layer 9 works not only as itself but as an orientation control layer for piezoelectric layer 10. Therefore, (001) or (100) plane of PZT (lattice constant: a=4.036 Å, c=4.146 Å) can be selectively produced, so as to provide favorable lattice matching with a surface (lattice constant: 3.84 Å) of LNO oriented to (100) plane.

Upper electrode layer 11 is formed of 0.3-μm-thick gold (Au) for instance. Besides Au, upper electrode layer 11 may be formed of any material as long as it is a conductive material and its film thickness is in a range between 0.1 μm and 0.5 μm. Upper electrode layer 11 is desirably produced by deposition, which is less likely to generate residual stress.

Next, a description is made of a method of producing the piezoelectric element shown in FIG. 1. First, a description is made of a method of forming diffusion prevention layer 8 and lower electrode layer 9.

To form diffusion prevention layer 8 on a surface of substrate 7, a $SiO_2$ precursor solution is applied by spin coating. Spin coating features a capability of easily applying a thin film with uniform thickness throughout the target surface by controlling the number of rotations per unit time. Hereafter, the applied film in an uncrystallized state is referred to as a precursor film.

For the $SiO_2$ precursor solution, various types of solutions produced by well-known methods can be used, such as a precursor solution primarily containing tetraethoxysilane (TEOS, $Si(OC_2H_5)_4$), methyl triethoxysilane (MTES, $CH_3Si(OC_2H_5)_3$), or perhydropolysilazane (PHPS, $SiH_2NH$), for instance. The $SiO_2$ precursor solution applied on both surfaces of substrate 7 is dried at 150° C. for 10 minutes, and then fired at 500° C. for 10 minutes. By repeating the operations until the film has a desired thickness, diffusion prevention layer 8 is formed.

Next, an LNO precursor solution for forming lower electrode layer 9 is applied onto diffusion prevention layer 8 described above. How to prepare this LNO precursor solution is as follows. Lanthanum nitrate hexahydrate ($La(NO_3)_3 \cdot 6H_2O$) and nickel acetate tetrahydrate (($CH_3COO)_2Ni \cdot 4H_2O$) is used as a starting material, and 2-methoxy ethanol and 2-aminoethanol are used as a solvent. 2-methoxy ethanol contains a slight amount of water, and thus the water is preliminarily removed using molecular sieves of a hole diameter of 0.3 nm before using.

First, lanthanum nitrate hexahydrate is taken into a beaker and dried at 150° C. for 1 hour or more to remove the hydrate. Next, after cooling it to the room temperature, 2-methoxy ethanol is added and agitated at the room temperature for 3 hours to dissolve the lanthanum nitrate (solution A).

Meanwhile, nickel acetate tetrahydrate is taken into another separable flask and dried at 200° C. for 2 hours to remove the hydrate. Next, 2-methoxy ethanol and 2-aminoethanol are added and agitated at 110° C. for 30 minutes (solution B).

After cooling solution B to the room temperature, solution A is put into the separable flask containing solution B. The mixed liquid is agitated at the room temperature for 3 hours to produce an LNO precursor solution.

Next, the LNO precursor solution applied on all over substrate 7 is dried at 150° C. for 10 minutes. Subsequently, the dried one is heat-treated at 350° C. for 10 minutes to thermally decompose residual organic components. The drying step aims at removing physically adsorbed water in the LNO precursor solution, where the desirable temperature is greater that 100° C. and lower than 200° C. The step is for preventing water from remaining in the produced film. At higher than 200° C., residual organic components in the LNO precursor solution start decomposing, and thus drying is desirably performed at a lower temperature. The thermal decomposition step is desirably performed at a temperature of 200° C. or greater and lower than 500° C. This step, which is for preventing organic components from remaining in the produced film, is desirably performed at a temperature lower than 500° C. because crystallization of the dried LNO precursor solution greatly proceeds at 500° C. or higher.

The processes from applying the LNO precursor solution onto diffusion prevention layer 8 to thermally decomposing it are repeated a plurality of times. When the LNO precursor produced in this way reaches a desired thickness, the precursor is rapidly heated using a rapid thermal annealing furnace (described as an RTA furnace hereafter) to perform a crystallization step, where its condition is heating at 700° C. for 5 minutes at a temperature rising speed of 200° C. per minute. The heating temperature in the crystallization step is desirably between 500° C. and 750° C., inclusive. The crystallization of LNO is promoted at 500° C. or higher. On the other hand, at 750° C. or higher, the crystallinity of LNO decreases. Subsequently, the crystallized one is cooled to the room temperature. Forming lower electrode layer 9 by the above steps provides LNO with high orientation toward (100) plane. To make lower electrode layer 9 reach a desired film thickness, the steps from application to crystallization may be repeated every time instead of collectively crystallizing after repeating the steps from application (more than once) to thermal decomposition.

As described above, lower electrode layer 9 is composed of first lower electrode layer 9a and second lower electrode layer 9b. First lower electrode layer 9a is positioned closer to substrate 7 and has a porous structure. Second lower electrode layer 9b is positioned closer to piezoelectric layer 10 and has a closely packed structure with less pores than first lower electrode layer 9a. To form first lower electrode layer 9a and second lower electrode layer 9b, conditions for applying the LNO precursor solution have only to be changed to adjust the application thickness of the LNO precursor film, For instance, the LNO precursor solution for first lower electrode layer 9a will have a larger application thickness than second lower electrode layer 9b.

As a solvent of the LNO precursor solution for lower electrode layer 9 described above, 2-methoxy ethanol and 2-aminoethanol, both having large molecular weights, are used. These solvents cause an alcohol exchange reaction with lanthanum nitrate and nickel acetate in the process of preparing an LNO precursor solution to generate metal alkoxide. This alkoxide part forms a porous structure when the part is decomposed by heat treatment to produce inorganic oxide.

Thus, for a larger application thickness of the LNO precursor film, a larger amount of organic matter supposedly desorbs from the inside of the film during pre-firing. Further, the LNO precursor film having a larger thickness is supposedly less likely to be dense than that having a smaller thickness. From the reasons above, to form second lower electrode layer 9b, the steps from application to crystallization are preferably repeated every time to achieve a desired film thickness.

Figure 2A:
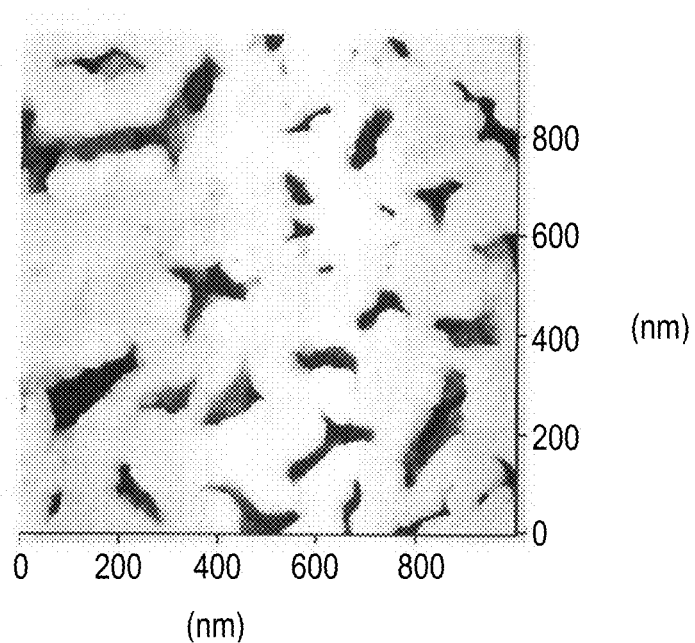
FIG. 2A illustrates an AFM image of a surface of the first lower electrode layer of the piezoelectric element shown in FIG. 1.
Figure 2B:
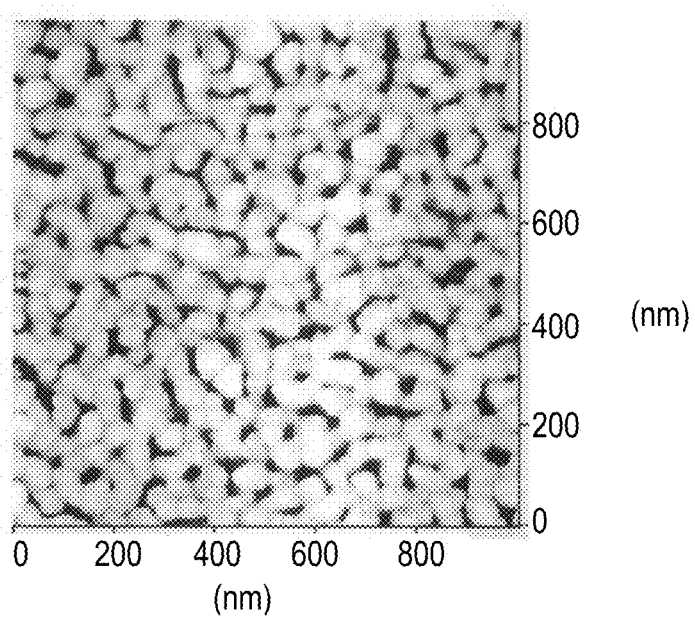
FIG. 2B illustrates an AFM image of a surface of the second lower electrode layer of the piezoelectric element shown in FIG. 1.

FIG. 2A shows a surface AFM image of first lower electrode layer 9a and FIG. 2B shows a surface AFM image of second lower electrode layer 9b. These results prove that lower electrode layer 9 having a desired structure has been achieved.

To adjust the thickness of the LNO precursor film in spin coating for instance, increasing the rotation speed of substrate 7 makes the film thickness thinner. In dip coating, decreasing the pull-up speed makes the film thickness thinner.

In the above description, the thickness of the LNO precursor thin film is adjusted to control the microstructure (e.g., the number, size, and distribution of pores) of the film, but not limited to this method. The concentration of the LNO precursor solution and the kind of the solvent may be changed. For example, the LNO precursor solution for forming first lower electrode layer 9a can have a larger molecular weight than second lower electrode layer 9b. To adjust the molecular weight, the solvent has only to be selected from ethanol, acetic acid, or a mixture of ethanol or acetic acid and water, for instance, where ethanol and acetic acid have a smaller molecular weight than 2-methoxy ethanol and 2-aminoethanol. These are the steps of forming diffusion prevention layer 8 and lower electrode layer 9, where first lower electrode layer 9a and second lower electrode layer 9b are made of the same material.

Next, a description is made of a method of producing piezoelectric layer 10. First, a PZT precursor solution is prepared, and then the PZT precursor solution is applied onto substrate 7 on which lower electrode layer 9, or diffusion prevention layer 8 and lower electrode layer 9 are formed. How to prepare a PZT precursor solution is as follows. Ethanol used for the preparation method is to be dehydrated ethanol (preliminarily dehydrated) in order to prevent hydrolysis of metal alkoxide due to a water content.

First, as a starting material for preparing a Pb precursor solution, lead acetate (II) trihydrate ($Pb(OCOCH_3)_2 \cdot 3H_2O$) is used. The material is taken into a separable flask and dried for two hours or more to remove hydrate. Next, dehydrated ethanol is added to dissolve the material and the material with dehydrated ethanol is refluxed while bubbling ammonia gas to produce a Pb precursor solution.

As starting materials for preparing a Ti—Zr precursor solution, titanium isopropoxide ($Ti(OCH(CH_3)_2)_4$) and zirconium normal propoxide ($Zr(OCH_2CH_2CH_3)_4$) are used. Dehydrated ethanol is added to dissolve the materials and the material with dehydrated ethanol is refluxed to produce a Ti—Zr precursor solution. The materials are weighed so that Ti/Zr ratio will be Ti:Zr=47:53 in molar ratio.

The Ti—Zr precursor solution is mixed with the Pb precursor solution. At this moment, the mixed solution contains an excess of 20 mol % Pb components over the stoichiometry ($Pb(Zr_{0.53}, Ti_{0.47})O_3$). This is for compensating for a shortage due to volatilization of the lead component during annealing. This mixed solution is refluxed at 78° C. for 4 hours, 0.5 mol equivalents of acetylacetone as a stabilizer with respect to the total quantity of metal cations, and then the solution is refluxed for another 1 hour to produce a PZT precursor solution.

Examples of the application method include various types of coating such as dip coating and spray coating, besides spin coating.

After the spin coating completes, the PZT precursor solution forms a wet PZT precursor film by vaporization of the solvent and hydrolysis. To remove water and a residual solvent contained in the PZT precursor film, the film is dried in a 115° C. drying furnace for 10 minutes. At 200° C. or higher, residual organic components in the PZT precursor solution start decomposing, and thus the temperature in the drying step is desirably between 100° C. and 200° C., exclusive.

Next, to decompose organic matter chemically combined in the dried PZT precursor film, the film is pre-fired in a 420° C. electric furnace for 10 minutes. At 500° C. or higher, crystallization of the dried PZT precursor film greatly proceeds, and thus the temperature of the pre-firing step is desirably 200° C. or higher and lower than 500° C. The steps from application of the PZT precursor solution to pre-firing are repeated more than once (e.g., three times) to form a PZT precursor film.

Subsequently, to crystallize the PZT precursor film, a crystallization step is performed. In this crystallization step, the entire material including the PZT precursor film is rapidly heated using an RTA furnace, where the heating condition is at 650° C. for approximately 5 minutes at a temperature rising speed of 200° C. per minute.

Heating temperature in the crystallization step is desirably between 500° C. and 750° C., inclusive. At a temperature higher than 750° C., Pb contained in the PZT precursor film during crystallization vaporizes to cause shortage, which decreases the crystallinity of formed piezoelectric layer 10. To adequately advance crystallization, heating in the crystallization step is performed for at least 1 minute.

Piezoelectric layer 10 formed in the above step has a thickness of about 50 nm to 400 nm. When a larger thickness is required, the step is repeated more than once to form piezoelectric layer 10 with a desired thickness. To achieve a desired thickness, the following steps may be performed: the steps of applying the PZT precursor solution to form a PZT precursor film; and drying the PZT precursor film are repeated more than once to form the PZT precursor film with a desired thickness; and then the step of collectively crystallizing is perform.

Figure 3:
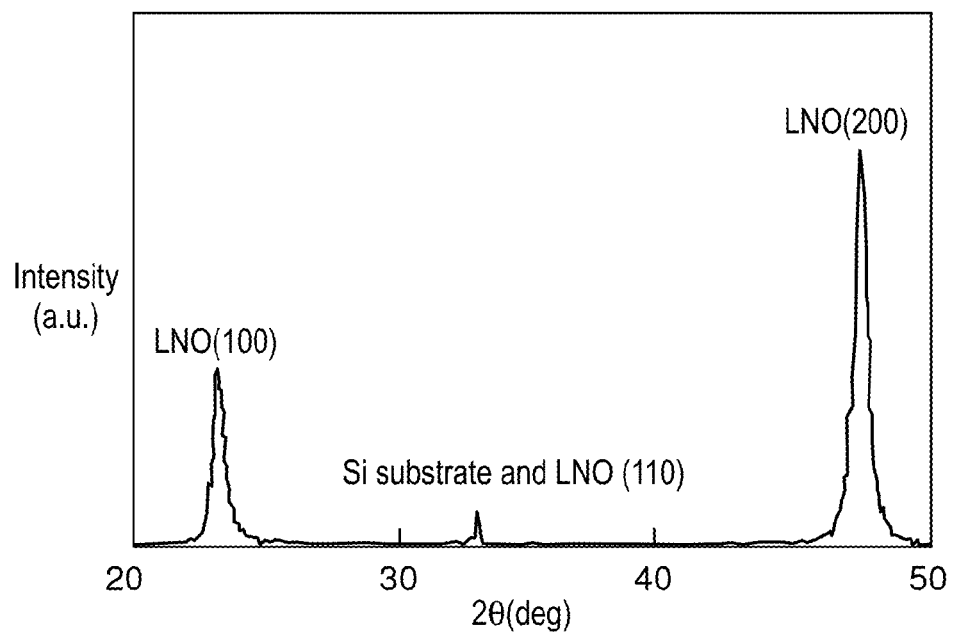
FIG. 3 is an X-ray diffraction pattern diagram of the lower electrode layer of the piezoelectric element shown in FIG. 1.
Figure 4:
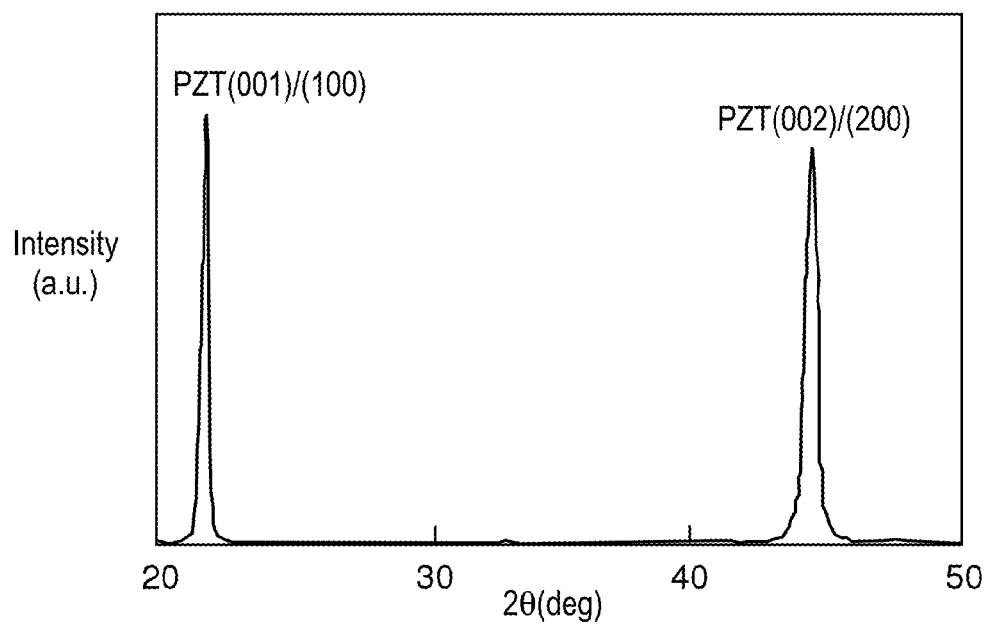
FIG. 4 is an X-ray diffraction pattern diagram of the piezoelectric layer of the piezoelectric element shown in FIG. 1.

Next, a description is made of results in which lower electrode layer 9 and piezoelectric layer 10 have been formed by the production method of the embodiment and the crystallinity has been evaluated by X-ray diffraction. FIG. 3 is an X-ray diffraction pattern diagram showing the results of evaluating the crystallinity of lower electrode layer 9, and FIG. 4 is an X-ray diffraction pattern diagram showing the results of evaluating the crystallinity of piezoelectric layer 10.

FIG. 3 proves that lower electrode layer 9 (LNO thin film) is preferentially oriented to (100) plane. FIG. 4 proves that piezoelectric layer 10 (PZT thin film) is preferentially oriented to (001) and (100) planes. Piezoelectric layer 10 has short interplanar spacing in (001) and (100) planes, and thus the X-ray diffraction pattern shown in FIG. 4 presents overlapped diffraction peaks, apparently one peak. Hence, it is difficult to determine the volume percentages of the components oriented to (001) and (100) planes.

Figure 5:
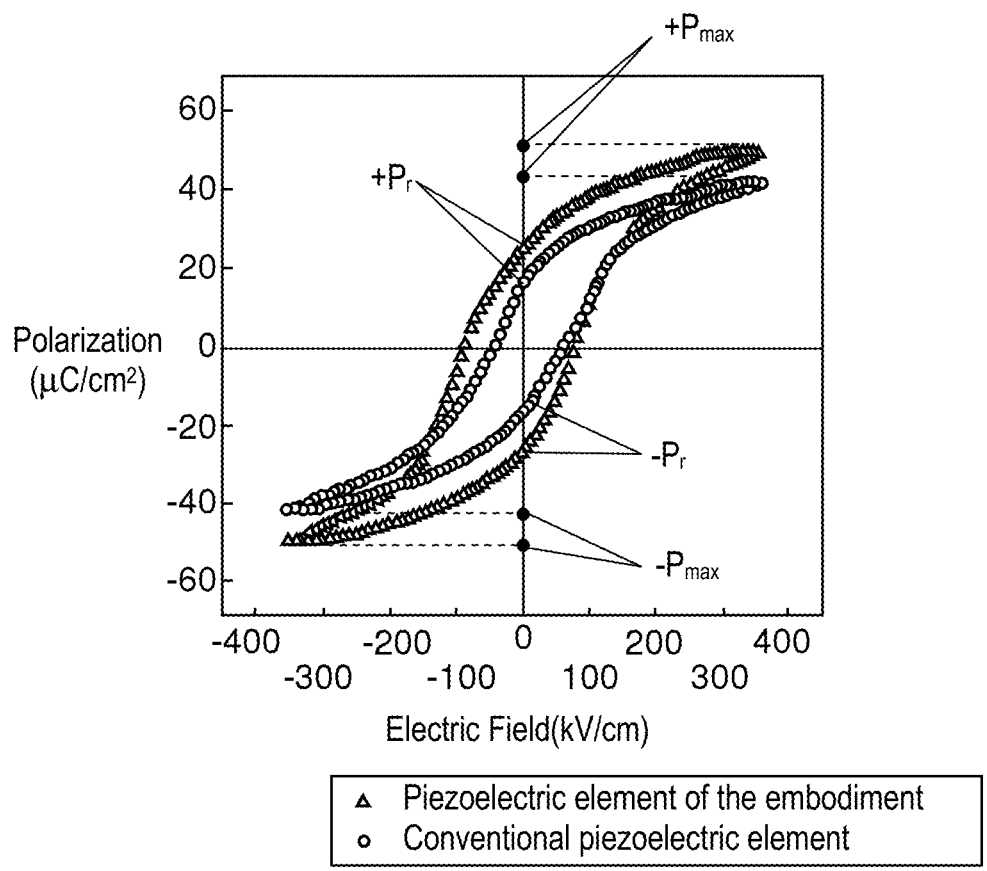
FIG. 5 is a characteristic diagram of the piezoelectric element shown in FIG. 1.

FIG. 5 shows results of measuring the characteristics (P-E hysteresis loop) of a piezoelectric element produced according to this embodiment. For comparison, the characteristics of a conventional piezoelectric element are shown together. The conventional piezoelectric element includes a diaphragm ($SiO_2$ thin film), an intermediate film (MgO thin film), an electrode film (Pt thin film), and a piezoelectric film (PZT thin film), all laminated in this sequence on substrate (Si) having a hollow, as shown in FIG. 9. FIG. 5 proves that the piezoelectric element of this embodiment has a larger polarization value of the P-E hysteresis loop and higher piezoelectric characteristics than the conventional one. The comparison of maximum polarization values $P_{max}$ and residual polarization values $P_r$ shown in FIG. 5 indicates that the conventional piezoelectric element has a $+P_{max}$ of approximately 42 $\mu C/cm^2$ and a $+P_r$ of approximately of 16 $\mu C/cm^2$. On the other hand, the piezoelectric element of this embodiment has a $+P_{max}$ and a $+P_r$ as high as 50 $\mu C/cm^2$ and 26 $\mu C/cm^2$, respectively. This is supposedly because of the following reason. First, by providing first lower electrode layer 9a with a porous film structure thermal stress from substrate 7 is relaxed. In addition, second lower electrode layer 9b has a larger thermal expansion coefficient than first lower electrode layer 9a, and thus a stronger compressive stress can be applied to piezoelectric layer 10. Consequently, the ratio of (001)-oriented components has increased and 90-degree domain rotation of (100)-oriented components is more likely to occur, thereby supposedly increasing components contributing to polarization.

For the piezoelectric characteristics of piezoelectric layer 10, a larger polarization value provides a larger displacement, thus, an element including piezoelectric layer 10 is expected to have a larger displacement than the conventional one.

An elemental analysis has been made on the cross section of a piezoelectric element produced in this embodiment to examine in-plane distribution of Pb. The elemental analysis is made by energy dispersive X-ray spectrometry (EDX). On this occasion, comparison is made with a piezoelectric element that is produced by forming piezoelectric layer 10 on lower electrode layer 9 that is a porous LNO thin film containing pores. For the piezoelectric element as the comparison example, the elemental analysis demonstrates that Pb of piezoelectric layer 10 has diffused to diffusion prevention layer 8. Meanwhile, for the piezoelectric element of this embodiment, diffusion of Pb is strongly suppressed, and thus the analysis does not demonstrates that Pb has diffused. From the above results, forming second lower electrode layer 9b closely packed (not containing pores), at the interface with piezoelectric layer 10 prevents Pb from diffusing to diffusion prevention layer 8 and substrate 7. Meanwhile, providing first lower electrode layer 9a with a porous film structure containing pores closer toward substrate 7 relaxes thermal stress caused by the difference of the thermal expansion coefficient from substrate 7 in the crystallization step and forms a piezoelectric element with favorable piezoelectric characteristics.

Upper electrode layer 11 is formed on piezoelectric layer 10 formed by the above production method as appropriate to produce a piezoelectric element. Upper electrode layer 11 is produced by ion beam deposition or resistance heating deposition, for instance.

As described above, piezoelectric layer 10 of PZT is formed on lower electrode layer 9 of LNO, which provides remarkably high crystal orientation as compared to the case where a piezoelectric layer is formed on a lower electrode layer of Pt, such as a conventional piezoelectric element.

Figure 6:
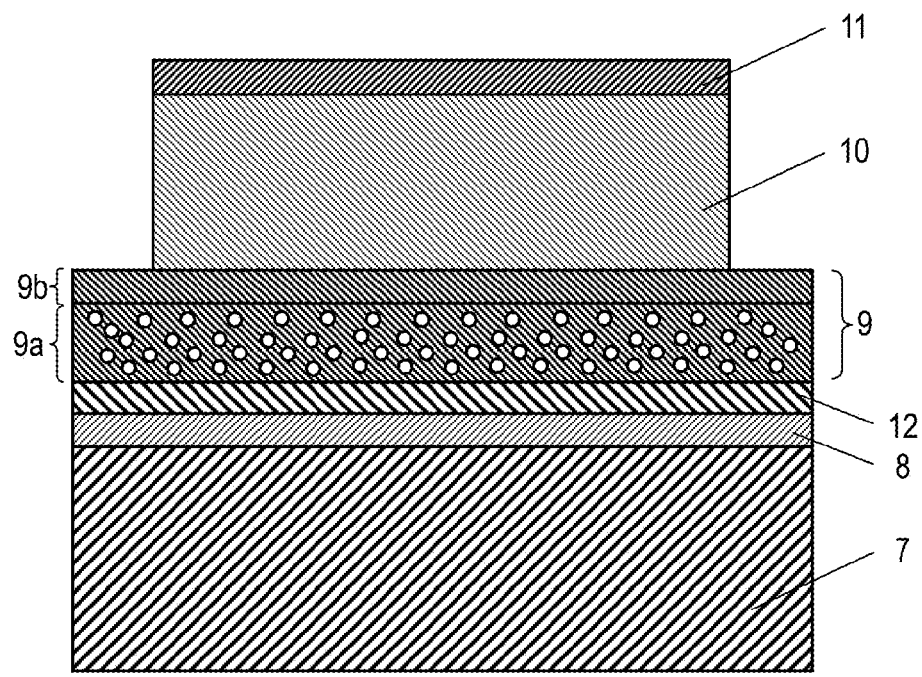
FIG. 6 is a sectional view of another piezoelectric element according to the embodiment of the present invention.

In a case that lower electrode layer 9 having a conductivity higher than that of LNO is formed, highly conductive layer 12 with a resistivity lower than that of lower electrode layer 9 may be placed between lower electrode layer 9 and diffusion prevention layer 8, as shown in FIG. 6. Desirably, highly conductive layer 12 is made of a noble metal material or noble metal oxide, such as platinum, ruthenium, iridium, rhenium, ruthenium oxide, iridium oxide, and rhenium oxide.

Diffusion prevention layer 8, lower electrode layer 9, and piezoelectric layer 10 are produced by CSD method, which eliminates the need for a vacuum process required in vapor growth method such as sputtering, thereby reducing the cost.

LNO used for lower electrode layer 9 formed by the production method of this embodiment can be self-oriented toward (100) plane, which means that the orientation direction is less dependent on the material of substrate 7. Therefore, there is no restriction on the material of substrate 7. Substrate 7 made of various types of materials (e.g., stainless-steel material) with high fracture toughness is preferable for a device subject to repeated vibration such as a sensor and actuator, thereby producing a piezoelectric element as a highly reliable product. A material with such a high fracture toughness, even if a defect such as a minute crack occurs in the process of producing a device, dramatically reduces risks of cleavage starting from the defect, as compared to a silicon substrate. This increases the production yield of devices.

Further, stainless-steel material is much cheaper than a silicon substrate, which advantageously reduces the cost of substrates by about one digit.

The diameter of pores in first lower electrode layer 9a does not need to be uniform, but preferably, it gradually increases from piezoelectric layer 10 toward substrate 7 (i.e., diffusion prevention layer 8). in this structure, the lower layer side with a larger diameter of pores relaxes stress caused by restraint of substrate 7. Furthermore, pores occupy a small region in first lower electrode layer 9a, which increases the mechanical strength of the entire piezoelectric element, thereby providing a highly reliable structure against repeated piezoelectric vibrations.

The diameter of the pores at least has only to be larger toward substrate 7, and thus the diameter may be expanded gradually or step by step in a layer structure. To control the diameter of the pores, LNO precursor films with different thicknesses have only to be multiply laminated when forming first lower electrode layer 9a, as described above. To gradually expand the diameter, the precursor film has only to be made thicker toward substrate 7 before crystallization. Alternatively, multilayered precursor films using a precursor solution with a larger molecular weight toward substrate 7 may be formed before crystallization. By these methods, the diameter of the pores can be easily controlled inside first lower electrode layer 9a.

Although measuring the porosity of such a thin film is difficult, the estimation from the AMF image shown in FIG. 2A indicates that the porosity is less than 15% at the cross section of an arbitrary position in the film thickness direction of first lower electrode layer 9a. A smaller porosity of second lower electrode layer 9b is more favorable.

Piezoelectric layer 10 formed of a polycrystalline material provides higher resistance against destruction caused by vibration than that formed of a monocrystalline material. This is because a monocrystalline material has strong bonding strength in the main surface of substrate 7 and does not relax stress by vibration to easily cause destruction while a polycrystalline material has grain boundaries in the main surface and can relax stress.

A heating furnace used in the step of crystallizing piezoelectric layer 10 is not limited to an RTA furnace, but an electric furnace or laser annealing may be used.

In this embodiment, lower electrode layer 9 is made of LNO, but not limited to this material. Various types of conductive oxide crystal substances can be used. Such examples include perovskite oxide primarily containing strontium ruthenium oxide and lanthanum-strontium-cobalt oxide, for instance, of a pseudo-cubic system, preferentially oriented to (100) plane. In those cases as well, the lattice constant of the main orientation plane is within roughly 10% of that of piezoelectric layer 10, thereby providing high orientation of (001) and (100) planes of piezoelectric layer 10.

Piezoelectric layer 10 is produced by CSD method, but not limited to this method. Various methods such as CVD and sputtering may be used.

The description is made using a plain plate as substrate 7, but the shape is not limited to a plain plate. The constitution is applicable to substrate 7 in a three-dimensional shape having a plurality of surfaces. The same advantage is achieved by performing a crystallization step after applying and forming precursor films for lower electrode layer 9 and piezoelectric layer 10 on a given surface.

In this way, piezoelectric layer 10 with high crystal orientation is formed on any position of a three-dimensional shape, thereby providing an actuator, for instance, capable of being displaced in multiple directions.

To further increase the piezoelectric characteristics, second lower electrode layer 9b may have a larger thermal expansion coefficient than first lower electrode layer 9a by using a material different from LNO for second lower electrode layer 9b.

Specifically, first lower electrode layer 9a is formed of a material containing LNO as the main component with a porous film structure. Then, second lower electrode layer 9b is formed of a material different from LNO, with a larger thermal expansion coefficient and with a closely packed film structure containing less pores than first lower electrode layer 9a. Such a material is, for instance, lanthanum-strontium-manganese oxide ((La, Sr)MnO$_3$, hereafter described as LSMO). Second lower electrode layer 9b formed of such a material, having a larger thermal expansion coefficient than first lower electrode layer 9a, applies a stronger compressive stress to piezoelectric layer 10 than the case where only first lower electrode layer 9a is used.

Figure 7:
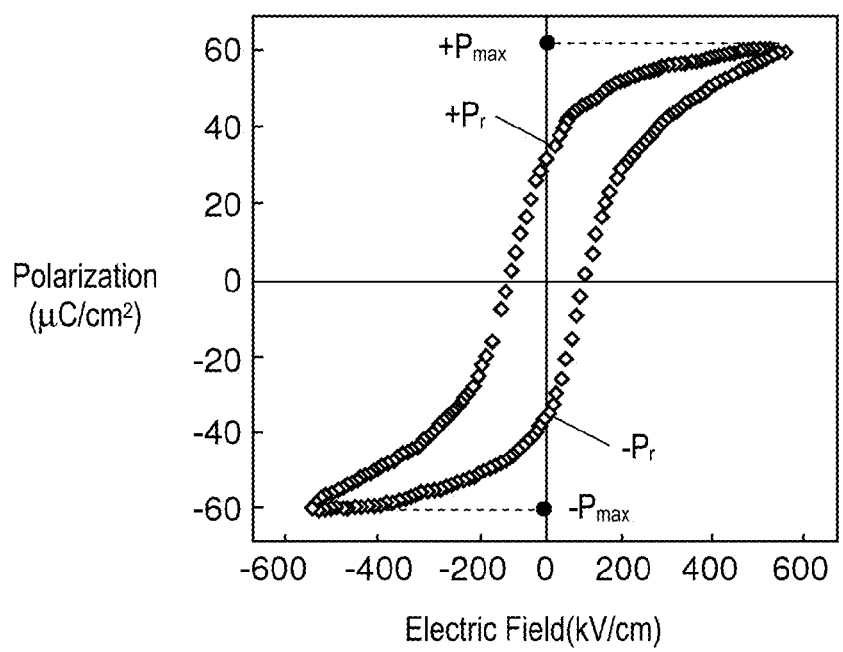
FIG. 7 is a characteristic diagram of yet another piezoelectric element according to the embodiment of the present invention.

FIG. 7 shows a P-E hysteresis loop of a piezoelectric element including second lower electrode layer 9b formed of LSMO. FIG. 7 indicates a large polarization value of the P-E hysteresis loop and excellent characteristics. Maximum polarization value $P_{max}$ and residual polarization value $P_r$ in FIG. 7 show a $+P_{max}$ and a $+P_r$ as high as approximately 62 μC/cm$^2$ and 35 μC/cm$^2$, respectively. This is supposedly because of the following reasons. First, a larger compressive stress is applied to piezoelectric layer 10 than the case where second lower electrode layer 9b is formed of LNO, which further increases the ratio of (001)-oriented components. Further, 90-degree domain rotation of (100)-oriented components is more likely to occur, thereby supposedly increasing components contributing to polarization.

Figure 8:
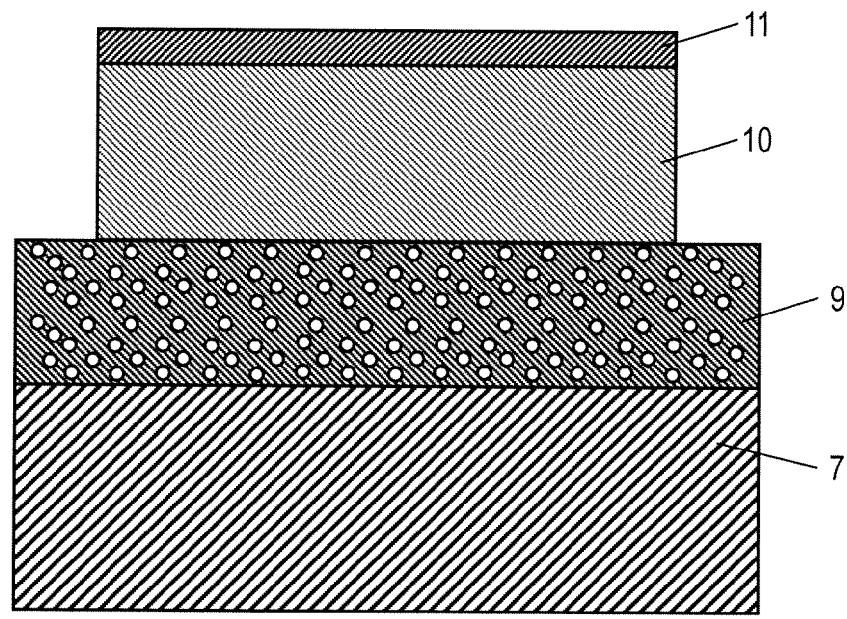
FIG. 8 is a sectional view of still another piezoelectric element according to the embodiment of the present invention.

As shown in FIG. 8, with second lower electrode layer 9b not provided, lower electrode layer 9 may be formed of a material primarily containing LNO with a porous film structure. In this case, lower electrode layer 9 has a larger thermal expansion coefficient than piezoelectric layer 10. Even this structure relaxes thermal stress from substrate 7. Furthermore, lower electrode layer 9 has a larger thermal expansion coefficient than piezoelectric layer 10, and thus stress as thermal stress can be applied to piezoelectric layer 10 in a compressive direction. Consequently, high piezoelectric characteristics appear. As described above, however, this structure is likely to diffuse lead from piezoelectric layer 10, and thus it is preferable that second lower electrode layer 9b is provided.

Industrial Applicability

As described above, the present invention provides various types of devices that are free from restrictions in the shape and material of a substrate and have high piezoelectric characteristics. More specifically, a piezoelectric element with high crystal orientation and an extremely large polarization value of the P-E hysteresis loop can be formed. This piezoelectric element has superior piezoelectric characteristics with a large piezoelectric displacement. Various types of electronic devices including the above-described piezoelectric element are useful for sensors such as angular velocity sensor and infrared sensor, and actuators such as piezoelectric actuator and ultrasonic motor.

The invention claimed is:

1. A piezoelectric element comprising:
   a substrate;
   a lower electrode layer fixed to the substrate;
   a piezoelectric layer formed on the lower electrode layer; and
   an upper electrode layer formed on the piezoelectric layer,
   wherein the lower electrode layer includes a conductive oxide layer containing pores therein, and has a larger thermal expansion coefficient than the piezoelectric layer.

2. The piezoelectric element according to claim 1, wherein a diameter of the pores is larger from the piezoelectric layer toward the substrate.

3. The piezoelectric element according to claim 1, wherein the substrate has a smaller thermal expansion coefficient than the piezoelectric layer.

4. The piezoelectric element according to claim 1,
   wherein the lower electrode layer includes a first lower electrode layer and a second lower electrode layer disposed in this order from the substrate, and
   wherein the first lower electrode layer contains pores and has a larger thermal expansion coefficient than the piezoelectric layer.

5. The piezoelectric element according to claim 4, wherein a diameter of the pores is larger in sequence from the piezoelectric layer toward the substrate.

6. The piezoelectric element according to claim 4, wherein the second lower electrode layer has a larger thermal expansion coefficient than the first lower electrode layer.

7. The piezoelectric element according to claim 6, wherein the first lower electrode layer and the second lower electrode layer are made of the same material.

8. The piezoelectric element according to claim 4, wherein a difference between a lattice constant of a main orientation plane of the second lower electrode layer and a lattice constant of a main orientation plane of the piezoelectric layer falls within ±10%.

9. The piezoelectric element according to claim 4, further comprising a highly conductive layer between the first lower electrode layer and the substrate, with the highly conductive layer having a resistivity smaller than a resistivity of the first lower electrode layer.

10. The piezoelectric element according to claim 4, wherein the substrate has a smaller thermal expansion coefficient than the piezoelectric layer.

11. A piezoelectric element comprising:
a substrate;
a lower electrode layer fixed to the substrate;
a piezoelectric layer formed on the lower electrode layer; and
an upper electrode layer formed on the piezoelectric layer, wherein:
the lower electrode layer contains pores therein and has a larger thermal expansion coefficient than the piezoelectric layer, and
a diameter of the pores is larger from the piezoelectric layer toward the substrate.

12. The piezoelectric element according to claim 11, wherein the substrate has a smaller thermal expansion coefficient than the piezoelectric layer.

13. A piezoelectric element comprising:
a substrate;
a first lower electrode layer disposed on the substrate;
a second lower electrode layer disposed on the first lower electrode layer;
a piezoelectric layer formed on the second lower electrode layer; and
an upper electrode layer formed on the piezoelectric layer, wherein the first lower electrode layer contains pores and has a larger thermal expansion coefficient than the piezoelectric layer.

14. The piezoelectric element according to claim 13, wherein a diameter of the pores is larger in sequence from the piezoelectric layer toward the substrate.

15. The piezoelectric element according to claim 13, wherein the second lower electrode layer has a larger thermal expansion coefficient than the first lower electrode layer.

16. The piezoelectric element according to claim 15, wherein the first lower electrode layer and the second lower electrode layer are made of the same material.

17. The piezoelectric element according to claim 13, wherein a difference between a lattice constant of a main orientation plane of the second lower electrode layer and a lattice constant of a main orientation plane of the piezoelectric layer falls within ±10%.

18. The piezoelectric element according to claim 13, further comprising a highly conductive layer between the first lower electrode layer and the substrate, with the highly conductive layer having a resistivity smaller than a resistivity of the first lower electrode layer.

19. The piezoelectric element according to claim 13, wherein the substrate has a smaller thermal expansion coefficient than the piezoelectric layer.

* * * * *